(12) United States Patent
Chen (10) Patent No.: US 11,223,346 B2
(45) Date of Patent: Jan. 11, 2022

(54) APPARATUS AND METHOD FOR REDUCING OUTPUT SKEW AND TRANSITION DELAY OF LEVEL SHIFTER

(71) Applicant: Samsung Electronics Co., Ltd., Gyeonggi-do (KR)

(72) Inventor: Chih-Wei Chen, Sunnyvale, CA (US)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 16/992,449

(22) Filed: Aug. 13, 2020

(65) Prior Publication Data
US 2020/0373916 A1 Nov. 26, 2020

Related U.S. Application Data

(63) Continuation of application No. 16/451,898, filed on Jun. 25, 2019, now Pat. No. 10,771,045.

(60) Provisional application No. 62/825,438, filed on Mar. 28, 2019.

(51) Int. Cl.
*H03K 3/012* (2006.01)
*H03K 3/356* (2006.01)
*H03K 19/0185* (2006.01)

(52) U.S. Cl.
CPC ....... *H03K 3/356017* (2013.01); *H03K 3/012* (2013.01); *H03K 19/0185* (2013.01)

(58) Field of Classification Search
None
See application file for complete search history.

(56) References Cited

U.S. PATENT DOCUMENTS

| | | | |
|---|---|---|---|
| 7,142,035 B2 | 11/2006 | Honda | |
| 7,245,153 B2 | 7/2007 | Murakami | |
| 8,497,726 B2 | 7/2013 | Ryu et al. | |
| 8,502,592 B2 | 8/2013 | Gion | |
| 8,872,571 B2 | 10/2014 | Hsieh | |
| 9,350,353 B2 | 5/2016 | Lin | |
| 9,496,870 B2 | 11/2016 | Oh et al. | |
| 2010/0117708 A1 | 5/2010 | Chen | |

*Primary Examiner* — Jeffery S Zweizig
(74) *Attorney, Agent, or Firm* — The Farrell Law Firm, P.C.

(57) ABSTRACT

An apparatus and method are provided. According to one embodiment, an apparatus includes a level-shifter circuit configured to output voltages Vol+ and Vol−; and an output alignment circuit configured to output voltages Vo+ and Vo− that are triggered by an edge of a combination of Vol+ and Vol−, and where Vo+ and Vo− are set by high states of Vol+ and Vol− prior to a transition on an input of the level-shifter circuit, and the method includes outputting, by a level-shifter circuit, voltages Vol+ and Vol−; and outputting, by an output alignment circuit, voltages Vo+ and Vo− that are triggered by an edge of a combination of Vol+ and Vol−, and where Vo+ and Vo− are set by high states of Vol+ and Vol− prior to a transition on an input of the level-shifter circuit.

20 Claims, 11 Drawing Sheets

APPARATUS AND METHOD FOR REDUCING OUTPUT SKEW AND TRANSITION DELAY OF LEVEL SHIFTER

PRIORITY

This application is a Continuation of U.S. patent application Ser. No. 16/451,898, filed on Jun. 25, 2019 in the United States Patent and Trademark Office, which claims priority under 35 U.S.C. § 119(e) to a U.S. Provisional Patent Application filed on Mar. 28, 2019 in the United States Patent and Trademark Office and assigned Ser. No. 62/825,438, the entire contents of which are incorporated herein by reference.

FIELD

The present disclosure relates generally to electronic circuits, and more particularly, to an apparatus and a method for reducing output skew and transition delay of a level shifter.

BACKGROUND

A power management integrated circuit (PMIC) may include multiple power supply voltages and power management functions within a single integrated circuit (IC). A PMIC may include a high voltage level shifter circuit.

A conventional high voltage level shifter circuit (e.g., a laterally diffused metal-oxide semiconductor field-effect transistor (MOSFET) (LDMOS), a drain-extended MOSFET (DEMOS)) uses large and slow high-voltage devices to handle large voltage differences (e.g., from e.g., 0 volt (V) to 6V, and from e.g., 17V to 23V). Due to a cross-coupled transistor pair structure, a positive output transition and a negative output transition experience large skew across process, voltage, and temperature (PVT) variations. Such a large skew may cause timing issues for succeeding blocks/stages of circuits. Furthermore, the slower output transition edge limits overall speed.

SUMMARY

According to one embodiment, an apparatus includes a level-shifter circuit configured to output voltages Vol+ and Vol−; and an output alignment circuit configured to output voltages Vo+ and Vo− that are triggered by an edge of a combination of Vol+ and Vol−, and where Vo+ and Vo− are set by high states of Vol+ and Vol− prior to a transition on an input of the level-shifter circuit.

According to one embodiment, a method includes outputting, by an output alignment circuit, voltages Vo+ and Vo− that are triggered by an edge of a combination of Vol+ and Vol−, and where Vo+ and Vo− are set by high states of Vol+ and Vol− prior to a transition on an input of the level-shifter circuit.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION OF EMBODIMENTS OF THE PRESENT DISCLOSURE

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Terms such as those defined in a generally used dictionary are to be interpreted to have the same meanings as the contextual meanings in the relevant field of art, and are not to be interpreted to have ideal or excessively formal meanings unless clearly defined in the present disclosure.

Figure 1:
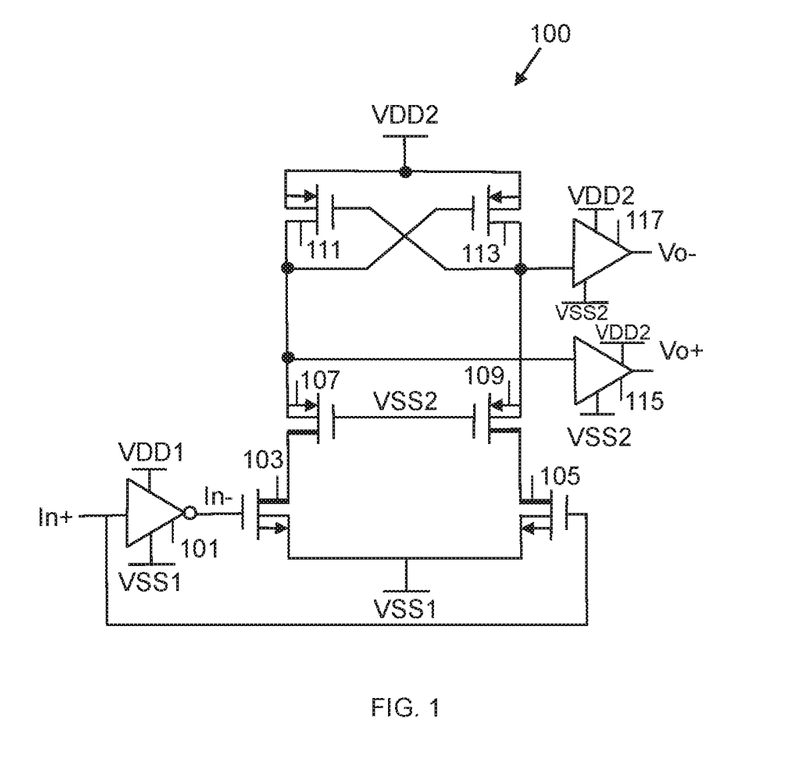
FIG. 1 is a diagram of a low-to-high voltage level shifter.

FIG. 1 is a diagram of a low-to-high voltage level shifter 100.

Referring to FIG. 1, the low-to-high voltage level shifter 100 includes an inverter 101, a first n-channel LDMOS (NLDMOS) transistor 103, a second NLDMOS transistor 105, a first p-channel LDMOS (PLDMOS) transistor 107, a second PLDMOS transistor 109, a first p-channel MOSFET (PMOS) transistor 111, a second PMOS transistor 113, a first buffer 115, and a second buffer 117.

The inverter 101 includes an input for receiving a voltage input signal In+, a power supply input for receiving a first power supply input voltage VDD1, a ground input for receiving a second power supply input voltage VSS1, and an output for outputting an output voltage In−, where In− is the inverse of In+. The first NLDMOS transistor 103 includes a drain terminal, a gate terminal connected to the output of the inverter 101, and a source terminal connected to the second power supply voltage VSS1. The second NLDMOS transistor 105 includes a drain terminal, a gate terminal connected to the input of the inverter 101, and a source terminal connected to the second power supply voltage VSS1. The first PLDMOS transistor 107 includes a drain terminal connected to the drain terminal of the first NLDMOS transistor 103, a gate terminal connected to a third power supply voltage VSS2, and a source terminal. The second PLDMOS transistor 109 includes a drain terminal connected to the drain terminal of the second NLDMOS transistor 105, a gate terminal connected to the third power supply voltage VSS2, and a source terminal. The first PMOS transistor 111 includes a drain terminal connected to the source terminal of the first PLDMOS transistor 107, a gate terminal, and a source terminal connected to a fourth power supply voltage VDD2. The second PMOS transistor 113 includes a drain terminal connected to the source terminal of the second PLDMOS transistor 109 and a gate terminal connected to the drain terminal of the first PMOS transistor 111 and the source terminal of the first PLDMOS transistor 107, and a source terminal connected to the fourth power supply voltage VDD2. The first buffer 115 includes an input connected to the source terminal of the first PLDMOS transistor 107, the drain terminal of the first PMOS transistor 111, and the gate terminal of the second PMOS transistor 113; a power supply voltage input connected to the fourth power supply voltage VDD2; a ground input connected to the third power supply voltage VSS2; and an output for outputting a voltage Vo+. The second buffer 117 includes an input connected to the source terminal of the second PLDMOS transistor 109, the gate terminal of the first PMOS transistor 111, and the drain terminal of the second PMOS transistor 113; a power supply voltage input connected to the fourth power supply voltage VDD2; a ground input connected to the third power supply voltage VSS2, and an output for outputting a voltage Vo−, where Vo− is the inverse of Vo+.

Figure 2:
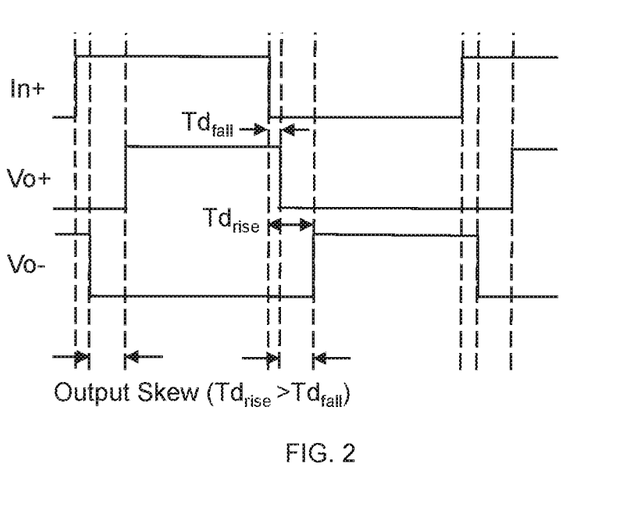
FIG. 2 is a timing diagram of the low-to-high voltage level shifter of FIG. 1.

FIG. 2 is an illustration of a timing diagram of the low-to-high voltage level shifter 100 of FIG. 1.

Referring to FIG. 2, the low-to-high voltage level shifter 100 has a large output skew due to a weak cross-coupled transistor pair and large high voltage device parasitics. Output skew varies across different PVT. Output skew (time duration of a falling edge of a voltage signal ($Td_{fall}$)<time duration of a rising edge of a voltage signal ($Td_{rise}$)) may cause a timing issue for a succeeding stage. Timing performance or speed of the low-to-high voltage level shifter is limited by the slower output transition ($Td_{rise}$ in this case).

Figure 3:
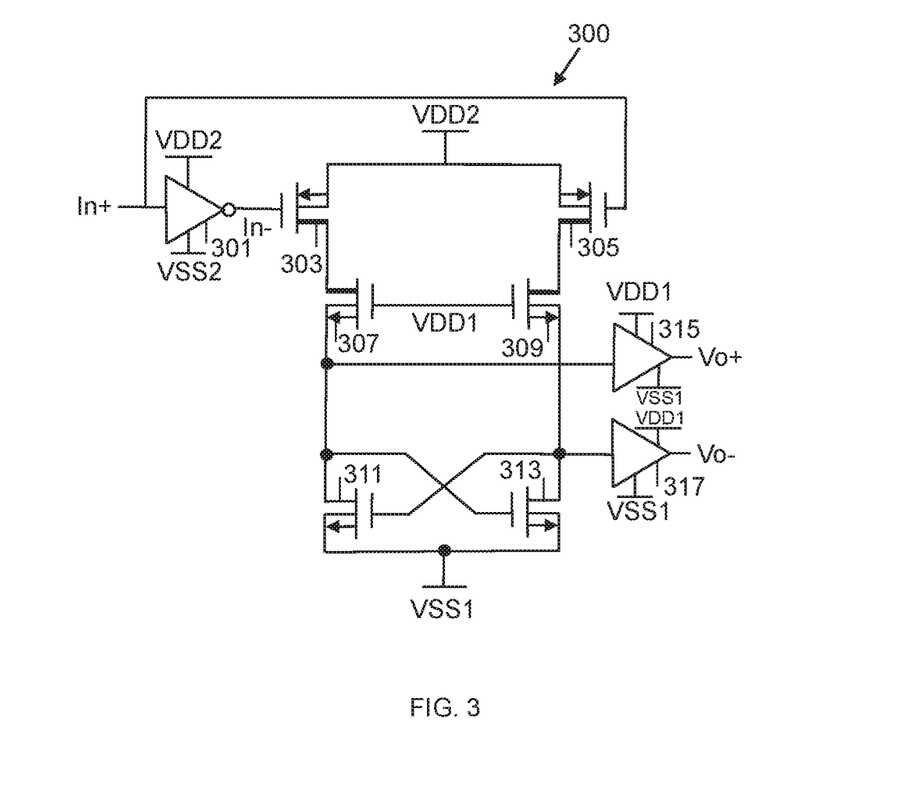
FIG. 3 is a diagram of a high-to-low voltage level shifter.

FIG. 3 is diagram of a high-to-low voltage level shifter 300.

Referring to FIG. 3, the high-to-low voltage level shifter 300 includes an inverter 301, a first PLDMOS transistor 303, a second PLDMOS transistor 305, a first NLDMOS transistor 307, a second NLDMOS transistor 309, a first n-channel MOSFET (NMOS) transistor 311, a second NMOS transistor 313, a first buffer 315, and a second buffer 317.

The inverter 301 includes an input for receiving a voltage input signal In+, a power supply input for receiving a first power supply input voltage VDD2, a ground input for receiving a second power supply input voltage VSS2, and an output for outputting an output voltage In−, where In− is the inverse of In+. The first PLDMOS transistor 303 includes a drain terminal, a gate terminal connected to the output of the inverter 301, and a source terminal connected to the first power supply voltage VDD2. The second PLDMOS transistor 305 includes a drain terminal, a gate terminal connected to the input of the inverter 301, and a source terminal connected to the first power supply voltage VDD2. The first NLDMOS transistor 307 includes a drain terminal connected to the drain terminal of the first PLDMOS transistor 303, a gate terminal connected to a third power supply voltage VDD1, and a source terminal. The second NLDMOS transistor 309 includes a drain terminal connected to the drain terminal of the second PLDMOS transistor 305, a gate terminal connected to the third power supply voltage VDD1, and a source terminal. The first NMOS transistor 311 includes a drain terminal connected to the source terminal of the first NLDMOS transistor 307, a gate terminal, and a source terminal connected to a fourth power supply voltage VSS1. The second NMOS transistor 313 includes a drain terminal connected to the source terminal of the second NLDMOS transistor 309 and the gate terminal of the first NMOS transistor 311, a gate terminal connected to the drain terminal of the first NMOS transistor 311 and the source terminal of the first NLDMOS transistor 307, and a source terminal connected to the fourth power supply voltage VSS1. The first buffer 315 includes an input connected to the source terminal of the first NLDMOS transistor 307, the drain terminal of the first NMOS transistor 311, and the gate terminal of the second NMOS transistor 313; a power supply voltage input connected to the third power supply voltage VDD1; a ground input connected to the fourth power supply voltage VSS1; and an output for outputting a voltage Vo+. The second buffer 317 includes an input connected to the source terminal of the second NLDMOS transistor 309, the gate terminal of the first NMOS transistor 311, and the drain terminal of the second NMOS transistor 313; a power supply voltage input connected to the third power supply voltage VDD1; a power ground input connected to the fourth power supply voltage VSS1; and an output for outputting a voltage Vo−, where Vo− is the inverse of Vo+.

Figure 4:
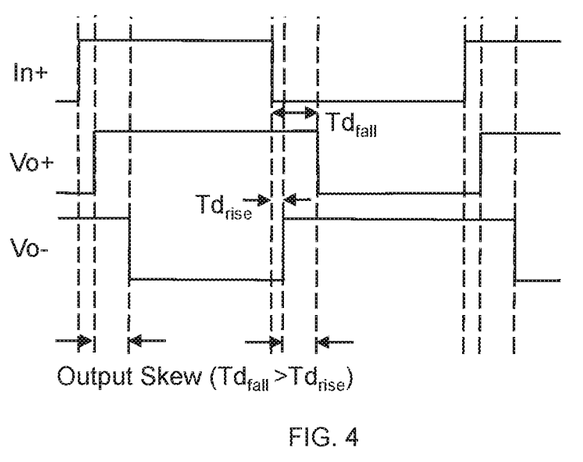
FIG. 4 is a timing diagram of the high-to-low voltage level shifter of FIG. 3.

FIG. 4 is an illustration of a timing diagram of the high-to-low voltage level shifter 300 of FIG. 3.

Referring to FIG. 4, the output skew of the high-to-low voltage level shifter 300 varies across PVT. The output skew ($Td_{fall}$>$Td_{rise}$) may cause timing issue for a succeeding stage. Speed of the high-to-low voltage level shifter 300 may be limited by the slower output transition ($Td_{fall}$ in this case).

Figure 5:
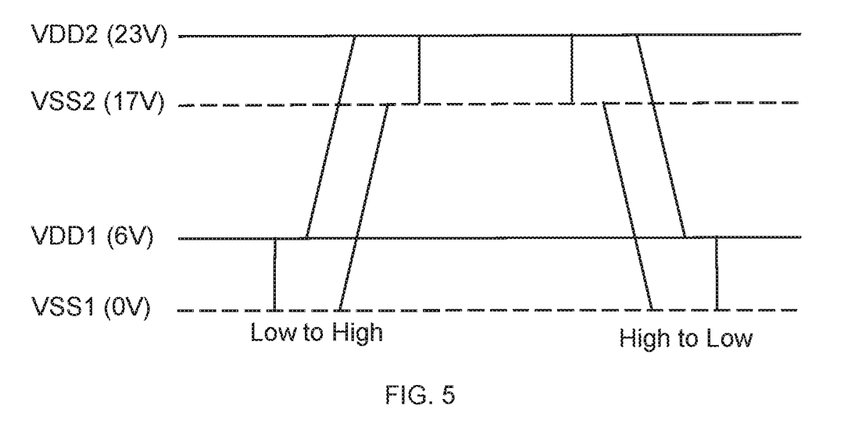
FIG. 5 is an illustration of voltage transitions for a low-to-high voltage level shifter and a high-to-low voltage level shifter.

FIG. 5 is an illustration of voltage transitions for a low-to-high voltage level shifter and a high-to-low voltage level shifter.

Referring to FIG. 5, the low-to-high voltage level shifter and the high-to-low voltage level shifter may each have a power supply voltage VSS1 of 0V, a power supply voltage VDD1 of 6V, a power supply voltage VSS2 of 17V, and a power supply voltage VDD2 of 23V. However, the present disclose is not limited to these particular voltages, and the present disclosure may use different voltages for VSS1, VDD1, VSS2, and VDD2.

Figure 6:
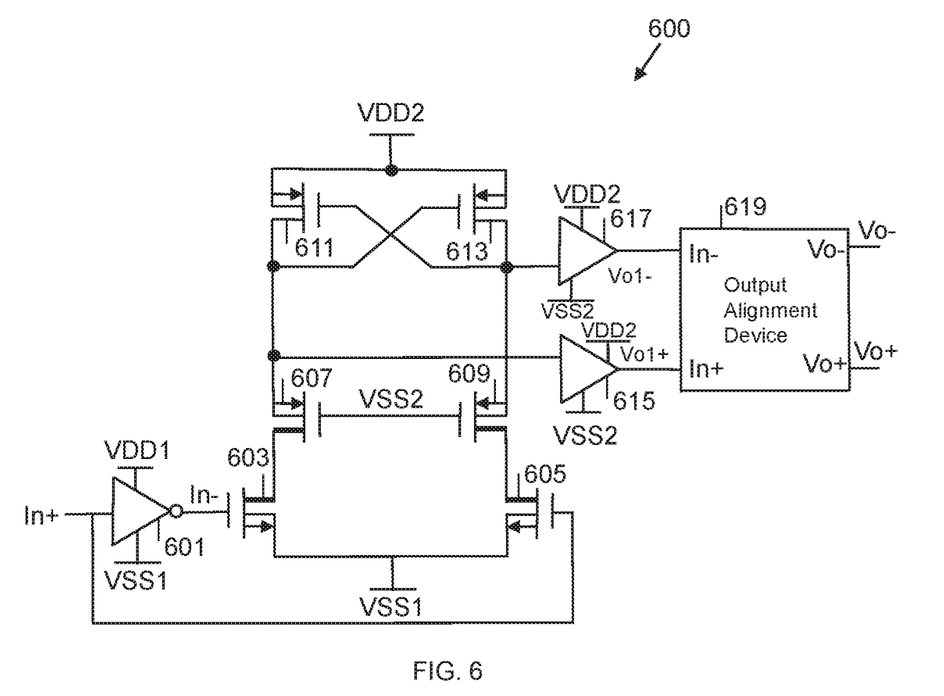
FIG. 6 is a diagram of a low-to-high voltage level shifter, according to one embodiment.

FIG. 6 is a diagram of a low-to-high level shifter 600, according to one embodiment.

Referring to FIG. 6, the low-to-high level shifter 600 includes an inverter 601, a first NLDMOS transistor 603, a second NLDMOS transistor 605, a first PLDMOS transistor 607, a second PLDMOS transistor 609, a first PMOS transistor 611, a second PMOS transistor 613, a first buffer 615, a second buffer 617, and an output alignment device 619.

The inverter 601 includes an input for receiving a voltage input signal In+, a power supply input for receiving a first power supply input voltage VDD1, a ground input for receiving a second power supply input voltage VSS1, and an output for outputting an output voltage In−, where In− is the inverse of In+. The first NLDMOS transistor 603 includes a drain terminal, a gate terminal connected to the output of the inverter 601, and a source terminal connected to the second power supply voltage VSS1. The second NLDMOS transistor 605 includes a drain terminal, a gate terminal connected to the input of the inverter 601, and a source terminal connected to the second power supply voltage VSS1. The first PLDMOS transistor 607 includes a drain terminal connected to the drain terminal of the first NLDMOS transistor 603, a gate terminal connected to a third power supply voltage VSS2, and a source terminal. The second PLDMOS transistor 609 includes a drain terminal connected to the drain terminal of the second NLDMOS transistor 605, a gate terminal connected to the third power supply voltage VSS2, and a source terminal. The first PMOS transistor 611 includes a drain terminal connected to the source terminal of the first PLDMOS transistor 607, a gate terminal, and a source terminal connected to a fourth power supply voltage VDD2. The second PMOS transistor 613 includes a drain terminal connected to the source terminal of the second PLDMOS transistor 609 and the gate terminal of the first PMOS transistor 611, a gate terminal connected to the drain terminal of the first PMOS transistor 611 and the source terminal of the first PLDMOS transistor 607, and a source terminal connected to the fourth power supply voltage VDD2. The first buffer 615 includes an input connected to the source terminal of the first PLDMOS transistor 607, the drain terminal of the first PMOS transistor 611, and the gate terminal of the second PMOS transistor 613; a power supply voltage input connected to the fourth power supply voltage VDD2; a ground input connected to the third power supply voltage VSS2; and an output for outputting a voltage Vol+. The second buffer 617 includes an input connected to the source terminal of the second PLDMOS transistor 609, the gate terminal of the first PMOS transistor 611, and the drain terminal of the second PMOS transistor 613; a power supply voltage input connected to the fourth power supply voltage VDD2; a ground input connected to the third power supply voltage VSS2; and an output for outputting a voltage Vol−, where Vol− is the inverse of Vol+. The output alignment device 619 includes a first input connected to the output of the first buffer 615 for receiving Vol+ as an input voltage In+, a second input connected to the output of the second buffer 617 for receiving Vol− as an input voltage In−, a first output for outputting an output voltage Vo+, and a second output for outputting an output voltage Vo−.

The present low-to-high level shifter provides minimum output skew, and outputs Vo+ and Vo−, where Vo+ and Vo− have similar delay (e.g., $Td_{fall}=Td_{rise}$) regardless of variations in PVT. The low-to-high level shifter 600 provides a faster transition speed (e.g., a shorter delay, $Td_{fall/rise}$).

Figure 7:
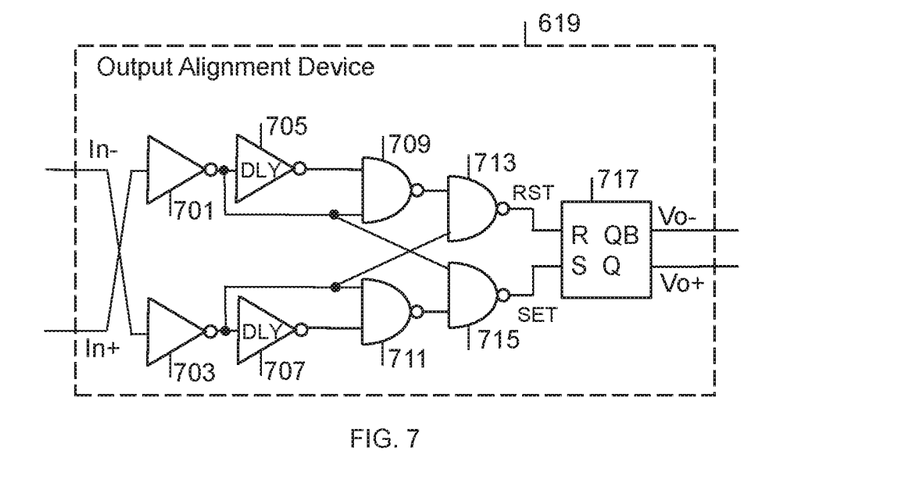
FIG. 7 is a diagram of an output alignment device of the low-to-high voltage level shifter of FIG. 6, according to one embodiment.

FIG. 7 is a diagram of the output alignment device 619 of the low-to-high voltage level shifter 600 of FIG. 6, according to one embodiment.

Referring to FIG. 7, the output alignment device 619 includes a first inverter 701, a second inverter 703, a third inverter 705, a fourth inverter 707, a first NAND gate 709, a second NAND gate 711, a third NAND gate 713, a fourth NAND gate 715, and a reset-set (RS) flip-flop 717.

The first inverter 701 includes an input for receiving a voltage Vol+ as an input voltage In+, and an output for outputting the inverse of Vol+. The second inverter 703 includes an input for receiving a voltage Vol− as an input voltage In−, and an output for outputting the inverse of Vol−. The third inverter 705 includes an input connected to the output of the first inverter 701, and an output for outputting the inverse of the output of the first inverter 701, where the third inverter 705 provides a delay. The fourth inverter 707 includes an input connected to the output of the second inverter 703, and an output for outputting the inverse of the output of the second inverter 703, where the fourth inverter 707 provides a delay.

The first NAND gate 709 includes a first input connected to the output of the first inverter 701, a second input connected to the output of the third inverter 705, and an output. The second NAND gate 711 includes a first input connected to the output of the second inverter 703, a second input connected to the output of the fourth inverter 707, and an output. The third NAND gate 713 includes a first input connected to the output of the second inverter 703, a second input connected to the output of the first NAND gate 709, and an output. The fourth NAND gate 715 includes a first input connected to the output of the first inverter 701, a second input connected to the output of the second NAND 711, and an output. The RS flip-flop 717 includes a first input connected to the output of the third NAND gate for receiving a reset signal (RST), a second input connected to the output of the fourth NAND gate 715 for receiving a set signal (SET), a first output for outputting a voltage Vo−, and a second output for outputting a voltage Vo+.

Figure 8:
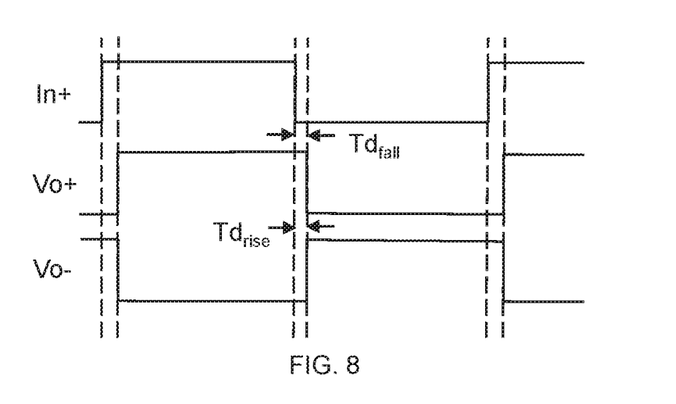
FIG. 8 is a timing diagram of the low-to-high voltage level shifter of FIG. 6, according to one embodiment.

FIG. 8 is an illustration of a timing diagram of the low-to-high voltage level sifter 600 of FIG. 6.

Referring to FIG. 8, $Td_{fall}$ is equal to $Td_{rise}$.

The present disclosure is not limited to using NAND gates in the output alignment device 619 of FIG. 7. The present disclosure includes any combination of logic gates that implement the equivalent logic of the output alignment device 619 of FIG. 7 and satisfies the timing diagram of FIG. 8.

Figure 9:
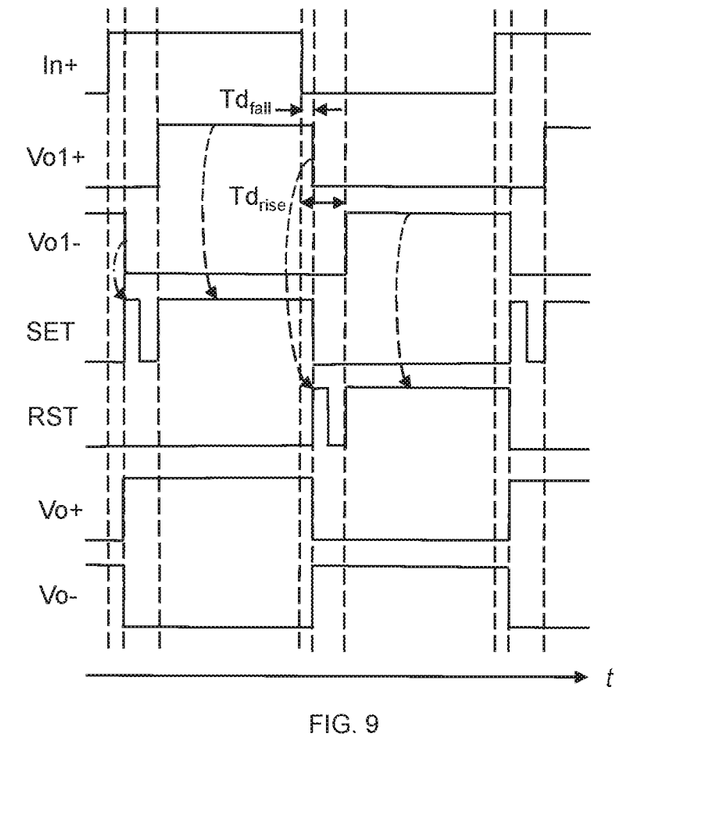
FIG. 9 is a timing diagram of the low-to-high voltage level shifter of FIG. 6, according to one embodiment.

FIG. 9 is a timing diagram of the low-to-high voltage level shifter 600 of FIG. 6, according to one embodiment.

Referring to FIG. 9, both outputs Vo+ and Vo− are triggered by an earlier edge (falling in this case) of inputs Vol+ and Vol−, respectively, which causes no output skew and a smaller delay. High states of inputs Vol+ and Vol− are used to set output states when there is no input transition initially.

Figure 10:
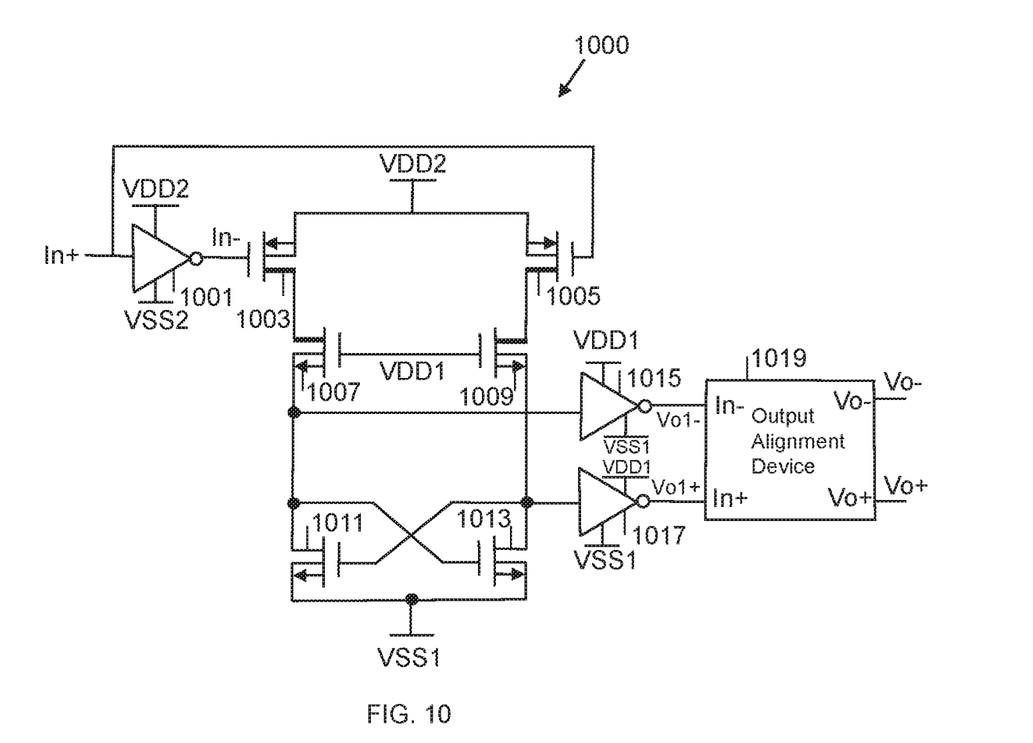
FIG. 10 is a diagram of a high-to-low voltage level shifter, according to one embodiment.

FIG. 10 is a diagram of a high-to-low voltage level shifter 1000, according to one embodiment.

Referring to FIG. 10, the high-to-low voltage level shifter 1000 includes a first inverter 1001, a first PLDMOS transistor 1003, a second PLDMOS transistor 1005, a first NLDMOS transistor 1007, a second NLDMOS transistor 1009, a first NMOS transistor 1011, a second NMOS transistor 1013, a second inverter 1015, a third inverter 1017, and an output alignment device 1019.

The first inverter 1001 includes an input for receiving a voltage input signal In+, a power supply input for receiving a first power supply input voltage VDD2, a ground input for receiving a second power supply input voltage VSS2, and an output for outputting an output voltage In−, where In− is the inverse of In+. The first PLDMOS transistor 1003 includes a drain terminal, a gate terminal connected to the output of the first inverter 1001, and a source terminal connected to the first power supply voltage VDD2. The second PLDMOS transistor 1005 includes a drain terminal, a gate terminal connected to the input of the first inverter 1001, and a source terminal connected to the first power supply voltage VDD2. The first NLDMOS transistor 1007 includes a drain terminal connected to the drain terminal of the first PLDMOS transistor 1003, a gate terminal connected to a third power supply voltage VDD1, and a source terminal. The second NLDMOS transistor 1009 includes a drain terminal connected to the drain terminal of the second PLDMOS transistor 1005, a gate terminal connected to the third power supply voltage VDD1, and a source terminal. The first NMOS transistor 1011 includes a drain terminal connected to the source terminal of the first NLDMOS transistor 1007, a gate terminal, and a source terminal connected to a fourth power supply voltage VSS1. The second NMOS transistor 1013 includes a drain terminal connected to the source terminal of the second NLDMOS transistor 1009 and the gate terminal of the first NMOS transistor 1011, a gate terminal connected to the drain terminal of the first NMOS transistor 1011 and the source terminal of the first NLDMOS transistor 1007, and a source terminal connected to the fourth power supply voltage VSS1. The second inverter 1015 includes an input connected to the source terminal of the first NLDMOS transistor 1007, the drain terminal of the first NMOS transistor 1011, and the gate terminal of the second NMOS transistor 1013; a power supply voltage input connected to the third power supply voltage VDD1; a ground input connected to the fourth power supply voltage VSS1; and an output for outputting a voltage Vol−. The third inverter 1017 includes an input connected to the source terminal of the second NLDMOS transistor 1009, the gate terminal of the first NMOS transistor 1011, and the drain terminal of the second NMOS transistor 1013; a power supply voltage input connected to the third power supply voltage VDD1; a ground input connected to the fourth power supply voltage VSS1; and an output for outputting a voltage Vol+, where Vol− is the inverse of Vol+. The output alignment device 1019 includes a first input connected to the output of the third inverter 1017 for receiving Vol+ as an input voltage In+, a second input connected to the output of the second inverter 1015 for receiving Vol− as an input voltage In−, a first output for outputting an output voltage Vo+, and a second output for outputting an output voltage Vo−.

The timing diagram of FIG. 10 is the same as the timing diagram of FIG. 8.

In FIG. 10, the second inverter 1015 and the third inverter 1017 are used instead of buffers as in FIG. 6 (i.e., the first buffer 615 and the second buffer 617).

The output alignment 1019 may be used to minimize output skew and transition delay of a level shifter. An earlier transition edge of inputs In+ and In− is used to trigger the outputs Vo+ and Vo−. Level information (e.g., high state) of inputs is used to guarantee output states when there is no input transition. Such an alignment method provided by the output alignment device 1019 may be used where similar signal alignment is required.

According to one embodiment, the high-to-low voltage level shifter 1000 may be part of a power management integrated circuit (IC) used for providing signals to a display device (e.g., a liquid crystal display (LCD) driver).

According to an embodiment, the high-to-low voltage level shifter 1000 with output aligning includes a level shifter circuit with outputs Vol+ and Vol−; and an output alignment circuit electrically coupled to the outputs of the level shifter circuit, where the output alignment circuit has outputs Vo+ and Vo− that are triggered by an earlier edge of either Vol+ or Vol−, and where the outputs Vo+ and Vo− are set by high states of Vol+ and Vol− when there is no input transition initially.

Figure 11:
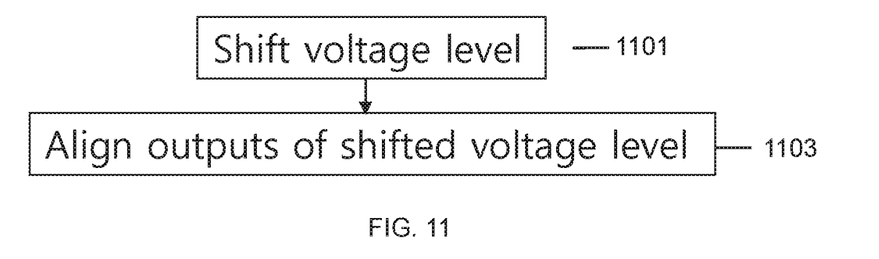
FIG. 11 is a flowchart of a method of aligning outputs of a voltage level shifter, according to one embodiment.

FIG. 11 is a flowchart of a method of aligning outputs of a voltage level shifter, according to one embodiment.

Referring to FIG. 11, a voltage level is shifted at 1101.

At 1103, outputs of the shifted voltage level are aligned.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. An apparatus, comprising:
   a level-shifter circuit configured to output voltages Vol+ and Vol−; and
   an output alignment circuit configured to:
   receive the output voltages Vol+ and Vol− from the level-shifter circuit;
   set a voltage Vo+ based on level information of Vol+ and set a voltage Vo− based on level information of Vol−;
   trigger voltages Vo+ and Vo− based on an edge of a combination of Vol+ and Vol−; and
   output voltages Vo+ and Vo−.

2. The apparatus of claim 1, wherein the output alignment circuit comprises:
   a first inverter configured to receive a first input signal;
   a second inverter configured to receive a second input signal, wherein the second input signal is an inverse of the first input signal;
   a third inverter connected to the first inverter;
   a fourth inverter connected to the second inverter;
   a logic circuit connected to the first inverter, the second inverter, the third inverter, and the fourth inverter; and
   a flip-flop connected to the logic circuit.

3. The apparatus of claim 2, wherein the logic circuit comprises:
   a first NAND gate connected to the first inverter and the third inverter;
   a second NAND gate connected to the second inverter and the fourth inverter;
   a third NAND gate connected to the second inverter and the first NAND gate; and
   a fourth NAND gate connected to the first inverter and the second NAND gate.

4. The apparatus of claim 2, wherein the level-shifter circuit is a low-to-high voltage shifter circuit.

5. The apparatus of claim 4, wherein the low-to-high voltage shifter circuit comprises:
   a fifth inverter configured to receive a third input signal and including a power supply input connected to a first power supply voltage VDD1 and a ground input connected to a second power supply voltage VSS1;
   a first n-channel transistor including a source connected to the second power supply voltage VSS1, a gate connected to an output of the fifth inverter, and a drain;
   a second n-channel transistor including a source connected to the second power supply voltage VSS1, a gate connected to an input of the fifth inverter, and a drain;
   a first p-channel transistor including a drain connected to the drain of the first n-channel transistor, a gate connected to a third power supply voltage VSS2, and a source;
   a second p-channel transistor including a drain connected to the drain of the second n-channel transistor, a gate connected to the third power supply voltage VSS2, and a source;
   a third p-channel transistor including a drain connected to the source of the first p-channel transistor, a gate, and a source connected to a fourth power supply voltage VDD2;
   a fourth p-channel transistor including a drain connected to the source of the second p-channel transistor and the gate of the third p-channel transistor, a gate connected to the drain of the third p-channel transistor, and a source connected to the fourth power supply voltage VDD2;
   a first buffer connected between the drain of the fourth p-channel transistor and the second inverter, and including a power supply input connected to the fourth power supply voltage VDD2 and a ground input connected to the third power supply voltage VSS2; and
   a second buffer connected between the source of the first p-channel transistor and the first inverter, and including a power supply input connected to the fourth power supply voltage VDD2 and a ground input connected to the third power supply voltage VSS2.

6. The apparatus of claim 5, wherein:
   the first n-channel transistor and the second n-channel transistor are each an n-channel laterally diffused metal-oxide semiconductor field-effect transistor (NLDMOS);
   the first p-channel transistor and the second p-channel transistor are each a p-channel laterally diffused metal-oxide semiconductor field-effect transistor (PLDMOS); and
   the third p-channel transistor and the fourth p-channel transistor are each a p-channel metal oxide semiconductor field-effect transistor (PMOS).

7. The apparatus of claim 1, wherein the output alignment circuit is configured to set a voltage Vo+ based on level information of Vol+ and set a voltage Vo− based on level information of Vol− when there is no prior input transition on the level-sifter circuit.

8. The apparatus of claim 2, wherein the level-shifter circuit is a high-to-low voltage shifter circuit.

9. The apparatus of claim 1, wherein the level information of Vol+ includes a high state of Vol+.

10. The apparatus of claim 1, wherein the level information of Vol− includes a high state of Vol−.

11. A method, comprising
    outputting, by a level-shifter circuit, voltages Vol+ and Vol−;
    receiving, by an output alignment circuit, the output voltages Vol+ and Vol− from the level-shifter circuit;
    setting, by the output alignment circuit, Vo+ based on level information of Vol+ and setting, by the output alignment circuit, Vo− based on level information of Vol−;
    triggering, by the output alignment circuit, voltages Vo+ and Vo− based on an edge of a combination of Vol+ and Vol−; and
    outputting, by the output alignment circuit, voltages Vo+ and Vo−.

12. The method of claim 11, further comprising:
    inverting, by a first inverter, a first input signal;
    inverting, by a second inverter, a second input signal, wherein the second input signal is an inverse of the first input signal;
    inverting, by a third inverter, an output of the first inverter;
    inverting, by a fourth inverter, an output of the second inverter;

reducing output skew and transition delay between the first input signal and the second input signal by a logic circuit connected to the first inverter, the second inverter, the third inverter, and the fourth inverter; and latching the reduced output skew and transition delay between the first input signal and the second input signal by a flip-flop connected to the logic circuit.

13. The method of claim 12, wherein the logic circuit comprises:
    a first NAND gate connected to the first inverter and the third inverter;
    a second NAND gate connected to the second inverter and the fourth inverter;
    a third NAND gate connected to the second inverter and the first NAND gate; and
    a fourth NAND gate connected to the first inverter and the second NAND gate.

14. The method of claim 12, further comprising shifting a voltage by a low-to-high voltage shifter circuit.

15. The method of claim 14, wherein the low-to-high voltage shifter circuit comprises:
    a fifth inverter configured to receive a third input signal and including a power supply input connected to a first power supply voltage VDD1 and a ground input connected to a second power supply voltage VSS1;
    a first n-channel transistor including a source connected to the second power supply voltage VSS1, a gate connected to an output of the fifth inverter, and a drain;
    a second n-channel transistor including a source connected to the second power supply voltage VSS1, a gate connected to an input of the fifth inverter, and a drain;
    a first p-channel transistor including a drain connected to the drain of the first n-channel transistor, a gate connected to a third power supply voltage VSS2, and a source;
    a second p-channel transistor including a drain connected to the drain of the second n-channel transistor, a gate connected to the third power supply voltage VSS2, and a source;
    a third p-channel transistor including a drain connected to the source of the first p-channel transistor, a gate, and a source connected to a fourth power supply voltage VDD2;
    a fourth p-channel transistor including a drain connected to the source of the second p-channel transistor and the gate of the third p-channel transistor, a gate connected to the drain of the third p-channel transistor, and a source connected to the fourth power supply voltage VDD2;
    a first buffer connected between the drain of the fourth p-channel transistor and the second inverter, and including a power supply input connected to the fourth power supply voltage VDD2 and a ground input connected to the third power supply voltage VSS2; and
    a second buffer connected between the source of the first p-channel transistor and the first inverter, and including a power supply input connected to the fourth power supply voltage VDD2 and a ground input connected to the third power supply voltage VSS2.

16. The method of claim 15, wherein:
    the first n-channel transistor and the second n-channel transistor are each an n-channel laterally diffused metal-oxide semiconductor field-effect transistor (NLDMOS);
    the first p-channel transistor and the second p-channel transistor are each a p-channel laterally diffused metal-oxide semiconductor field-effect transistor (PLDMOS); and
    the third p-channel transistor and the fourth p-channel transistor are each a p-channel metal oxide semiconductor field-effect transistor (PMOS).

17. The method of claim 11, wherein setting Vo+ based on level information of Vol+ and setting, by the output alignment circuit, Vo− based on level information of Vol− is performed when there is no prior input transition on the level-shifter circuit.

18. The method of claim 12, further comprising shifting a voltage by a high-to-low voltage shifter circuit.

19. The method of claim 11, wherein the level information of Vol+ includes a high state of Vol+.

20. The method of claim 11, wherein the level information of Vol− includes a high state of Vol−.

* * * * *